US008264426B2

(12) United States Patent
Chung

(10) Patent No.: US 8,264,426 B2
(45) Date of Patent: Sep. 11, 2012

(54) ORGANIC LIGHT EMITTING DISPLAY DEVICE AND A METHOD FOR GENERATING SCAN SIGNALS FOR DRIVING AN ORGANIC LIGHT EMITTING DISPLAY DEVICE HAVING A SCAN DRIVER

(75) Inventor: Bo-Yong Chung, Suwon-si (KR)

(73) Assignee: Samsung Display Co., Ltd., Yongin (KR)

( * ) Notice: Subject to any disclaimer, the term of this patent is extended or adjusted under 35 U.S.C. 154(b) by 1057 days.

(21) Appl. No.: 11/489,028

(22) Filed: Jul. 18, 2006

(65) Prior Publication Data

US 2007/0018918 A1 Jan. 25, 2007

(30) Foreign Application Priority Data

Jul. 22, 2005 (KR) .................. 10-2005-0066946

(51) Int. Cl.
*G09G 3/30* (2006.01)
(52) U.S. Cl. ............. 345/76; 345/100; 345/204; 377/64
(58) Field of Classification Search .................. 345/100, 345/76; 377/64
See application file for complete search history.

(56) References Cited

U.S. PATENT DOCUMENTS

| 3,937,984 | A | * | 2/1976 | Fry ................................. 377/79 |
| 5,633,653 | A | | 5/1997 | Atherton |
| 6,295,046 | B1 | * | 9/2001 | Hebiguchi ..................... 345/100 |
| 6,339,631 | B1 | * | 1/2002 | Yeo et al. ....................... 377/64 |
| 6,867,619 | B2 | * | 3/2005 | Hong et al. ..................... 326/97 |
| 6,970,530 | B1 | * | 11/2005 | Wang et al. ..................... 377/69 |
| 7,324,101 | B2 | * | 1/2008 | Miyazawa ..................... 345/211 |
| 2002/0109658 | A1 | | 8/2002 | Noguchi |
| 2004/0113873 | A1 | * | 6/2004 | Shirasaki et al. ............... 345/76 |
| 2004/0252084 | A1 | | 12/2004 | Miyagawa et al. |
| 2005/0220262 | A1 | * | 10/2005 | Moon ............................. 377/64 |

FOREIGN PATENT DOCUMENTS

| CN | 1617205 A | 5/2005 |
| EP | 1 531 450 A2 | 5/2005 |
| JP | 63-292772 | 11/1988 |
| JP | 11-086586 | 3/1999 |
| JP | 2005-148750 | 6/2005 |
| JP | 2005-285168 | 10/2005 |

OTHER PUBLICATIONS

Chinese Office action dated Oct. 10, 2008, for corresponding Chinese Patent application 2006101077326.
Japanese Office action dated Dec. 8, 2009, for corresponding Japanese application 2006-189074.
European Search Report dated Nov. 6, 2006, for 06117723.4, in the name of Samsung SDI Co., Ltd.

* cited by examiner

*Primary Examiner* — Grant Sitta
(74) *Attorney, Agent, or Firm* — Christie, Parker & Hale, LLP

(57) ABSTRACT

A system on panel (SOP)-type scan driver for an organic light emitting display (OLED) device. The scan driver includes flip-flops. Each of the flip-flops receives an input signal, a clock signal, and an inverted clock signal and outputs a scan signal. The scan signal is shifted and input to an adjacent flip-flop. Each of the flip-flops includes three transistors of the same conductivity type and a capacitor. Thus, layout area is minimized owing to simplification of circuits, and static current is cut off to reduce power consumption.

16 Claims, 6 Drawing Sheets

ORGANIC LIGHT EMITTING DISPLAY
DEVICE AND A METHOD FOR GENERATING
SCAN SIGNALS FOR DRIVING AN ORGANIC
LIGHT EMITTING DISPLAY DEVICE
HAVING A SCAN DRIVER

CROSS-REFERENCE TO RELATED
APPLICATION

This application claims priority to and the benefit of Korean Patent Application No. 10-2005-0066946, filed Jul. 22, 2005, in the Korean Intellectual Property Office, the entire content of which is incorporated herein by reference.

BACKGROUND OF THE INVENTION

1. Field of the Invention

The present invention relates to an organic light emitting display (OLED) device and, more particularly, to a system on panel (SOP) type scan driver which generates scan signals for selecting pixels located on a display region, and an OLED device having the same.

2. Description of the Related Art

Recent years have seen considerable research into flat panel displays (FPDs) because they can be made smaller and lighter than display devices using cathode ray tubes (CRTs). As a result, liquid crystal displays (LCDs), field emission displays (FEDs), plasma display panels (PDPs), and organic light emitting displays (OLEDs) have been developed and put to practical use. Among these FPDs, the PDP can have a large screen but has low luminance and poor luminous efficiency resulting in high power consumption, and the LCD has a relatively slow response speed and consumes a lot of power since it employs a backlight.

However, as the OLED makes use of an organic material to emit light, it has a wider viewing angle and faster response speed than the LCD. Also, the OLED is an emissive display that obtains good contrast and visibility. Further, the OLED enables lower power consumption and can be made thin and lightweight because it needs no backlight.

Nevertheless, the dimensions of an electroluminescent (EL) panel for a glass substrate are limited due to fabricating process limitations and the OLED may not be easily constructed to have a large screen. Also, if the screen is large, there is a greater probability of a defect occurring somewhere on the screen and thus a reduction in yield is unavoidable. Further, it is difficult to obtain uniformity across the screen.

As a solution to the above problems of the OLED, a tiling technique was developed. In the tiling technique, EL panels are bonded together like tiles to form a single panel.

Each of the EL panels includes pixels to display a predetermined image similar to a conventional OLED. In each of the EL panels, a scan driver applies a scan signal to enable the pixels, and a data driver applies a data signal to a selected pixel. Also, an emission control driver applies an emission control signal to each of the pixels in order to control the exact programming of the data signal and the time taken for an emission operation.

As described above, the scan driver, the data driver, and the emission control driver, which transmit various signals to drive the EL panels, can be electrically coupled to each of the EL panels in various manners.

For example, the scan driver, the data driver, and the emission control driver may be mounted as chips on a tape carrier package (TCP) that is bonded and electrically coupled to each of the EL panels. Alternatively, the drivers may be mounted as chips on a flexible printed circuit (FPC) or a film that is bonded and electrically coupled to each of the EL panels. The latter technique is referred to as a chip on flexible board (or chip on film) (COF) technique. In another method, the drivers are directly mounted on a glass substrate of the EL panel. This method is referred to as a chip on glass (COG) technique. These methods are costly and only complicate the modules, because the drivers should be separately designed and electrically coupled to one another.

To overcome these drawbacks, a system on panel (SOP) technique has been developed recently. Also, there have been attempts at designing a display region, scan and emission control drivers, and/or a data driver in each EL panel, in order to include all parts of the system in each of the EL panels.

In the OLED using the tiling technique, when each EL panel is formed as an SOP, it is easy to bond the EL panels to one another. Also, the SOP technique enables the area of drivers to be reduced and cost and labor for designing integrated circuits (ICs) of the respective drivers to be saved.

However, in order to develop the SOP-type OLED, it is necessary to consider many internal circumstances and conditions of the EL panels, such as a driving frequency and electron mobility of the data driver and/or the scan and emission control drivers. Up to present, it has been difficult to design the data driver within a panel because the data driver needs a high driving frequency.

Accordingly, the data driver is formed separately as an IC using complementary metal oxide semiconductor (CMOS) technology and subsequently coupled to the EL panel, while the scan driver and/or the emission control driver are formed within the EL panel.

Therefore, there is a need for a simple circuit construction in which an SOP-type scan driver and emission control driver can be optimally driven in the EL panel.

SUMMARY OF THE INVENTION

The present invention, therefore, provides a scan driver for an organic light emitting display (OLED) device, which is designed as a system on panel (SOP) type in an electroluminescent (EL) panel and generates scan signals for selecting pixels.

In an exemplary embodiment of the present invention, an OLED device includes a display region having pixels and displaying a predetermined image, a scan driver having flip-flops and applying a scan signal to sequentially select the pixels, a data driver applying a data signal to the pixels that are selected by the scan signal, and an emission control driver applying an emission control signal to control an emission operation of the pixels, wherein each of the flip-flops of the scan driver includes a first transistor, coupled between a positive power supply voltage terminal and a first node, and turned on/off according to a control signal applied to a gate terminal of the first transistor, a second transistor, coupled between the first node and an inverted control signal line and turned on/off according to a voltage at a second node coupled to a gate terminal of the second transistor, and a third transistor having a first electrode and a second electrode, wherein the first electrode of the third transistor is coupled to the second node and an input signal applied to the second electrode of the third transistor is transmitted to the first electrode of the third transistor according to the control signal applied to a gate terminal of the third transistor.

In another exemplary embodiment of the present invention, an OLED device includes a display region having pixels and displaying a predetermined image, a scan driver having flip-flops and applying a scan signal to sequentially select the pixels, a data driver applying a data signal to the pixels that are selected by the scan signal, and an emission control driver applying an emission control signal to control an emission operation of the pixels, wherein each of the flip-flops of the scan driver includes a first transistor, coupled between a positive power supply voltage terminal and a first node, and turned on/off according to a control signal applied to a gate terminal of the first transistor, a second transistor, coupled between the first node and one of a clock signal line and an inverted clock signal line and turned on/off according to a voltage at the second node coupled to a gate terminal of the second transistor, a third transistor having a first electrode and a second electrode, wherein the first electrode of the third transistor is coupled to a second node and an input signal applied to the second electrode of the third transistor is transmitted to the first electrode of the third transistor according to the control signal applied to a gate terminal of the third transistor, and a control signal input portion, commonly coupled to the gate terminals of the first and third transistors and applying the control signal of a low or high level in response to one of the clock signal and the inverted clock signal.

The control signal input portion may include a fourth transistor, coupled between a negative power supply voltage terminal and the gate terminal of the first transistor and the gate terminal of the third transistor, and turned on/off in response to either the clock signal or the inverted clock signal, and a fifth transistor, coupled between a positive power supply voltage terminal and the gate terminal of the first transistor and the gate terminal of the third transistor, and turned on/off in response to either the inverted clock signal or the clock signal.

Another exemplary embodiment presents an organic light emitting display device including a data driver for generating data signals corresponding to an image to be displayed by the device, and an electroluminescent panel coupled to the data driver. The electroluminescent panel may include a scan driver for generating scan signals. The scan driver may have flip-flops coupled together, a first flip-flop for receiving a clock signal as a control signal and a start pulse as an input signal and generating a first scan signal, a second flip-flop for receiving an inverted clock signal as a control signal and the first scan signal as an input signal and generating a second scan signal, the second scan signal being shifted by half cycle of the clock signal with respect to the first scan signal, an emission control driver for generating emission control signals, and a display region. The display region may include pixels coupled to the data driver, the scan driver and the emission control driver, for receiving the data signals, the scan signals and the emission control signals, the pixels being controlled by the scan signals and the emission control signals, the pixels for generating light according to the data signals. Each of the flip-flops may include three transistors of a first conductivity type and a capacitor. Each of the flip-flops may further include a control signal input portion having two transistors also of the first conductivity type, and each of the flip-flops may receive the clock signal or the inverted clock signal at the control signal input portion.

In another embodiment, a method for generating scan signals for driving an organic light emitting display device is presented. The device may include a scan driver comprised of flip-flops coupled together in series, a first one of the flip-flops receiving a start pulse as input and each of the flip-flops after the first flip-flop receiving an output signal of a previous one of the flip-flops as input, and the output signal of each one of the flip-flops being one of the scan signals. The method includes providing a clock signal having a low level during a first half clock cycle to the first one of the flip-flops, providing the start pulse having the low level during the first half clock cycle to the first one of the flip-flops, generating a first one of the scan signals by the first one of the flip-flops, the first one of the scan signals having a high level during the first half clock cycle and the low level during a second half clock cycle, providing an inverted clock signal having the low level during a second half clock cycle to a second one of the flip-flops coupled to the first one of the flip-flops, providing the first one of the scan signals to the second one of the flip-flops, and generating a second one of the scan signals by the second one of the flip-flops, the second one of the scan signals having the high level during the first half clock cycle and the second half clock cycle and the low level during a third half clock cycle.

The flip-flops include transistors of only a first conductivity type. Each of the flip-flops may further include a control signal input portion having transistors of the first conductivity type. The method may also include providing the clock signal to the first one of the flip-flops through the control signal input portion of the first one of the flip-flops and providing the inverted clock signal to the second one of the flip-flops through the control signal input portion of the second one of the flip-flops.

BRIEF DESCRIPTION OF THE DRAWINGS

The above and other features of the present invention will be described in reference to certain exemplary embodiments thereof with reference to the attached drawings in which.

DETAILED DESCRIPTION

The present invention will now be described more fully hereinafter with reference to the accompanying drawings, in which exemplary embodiments of the invention are shown.

Figure 1:
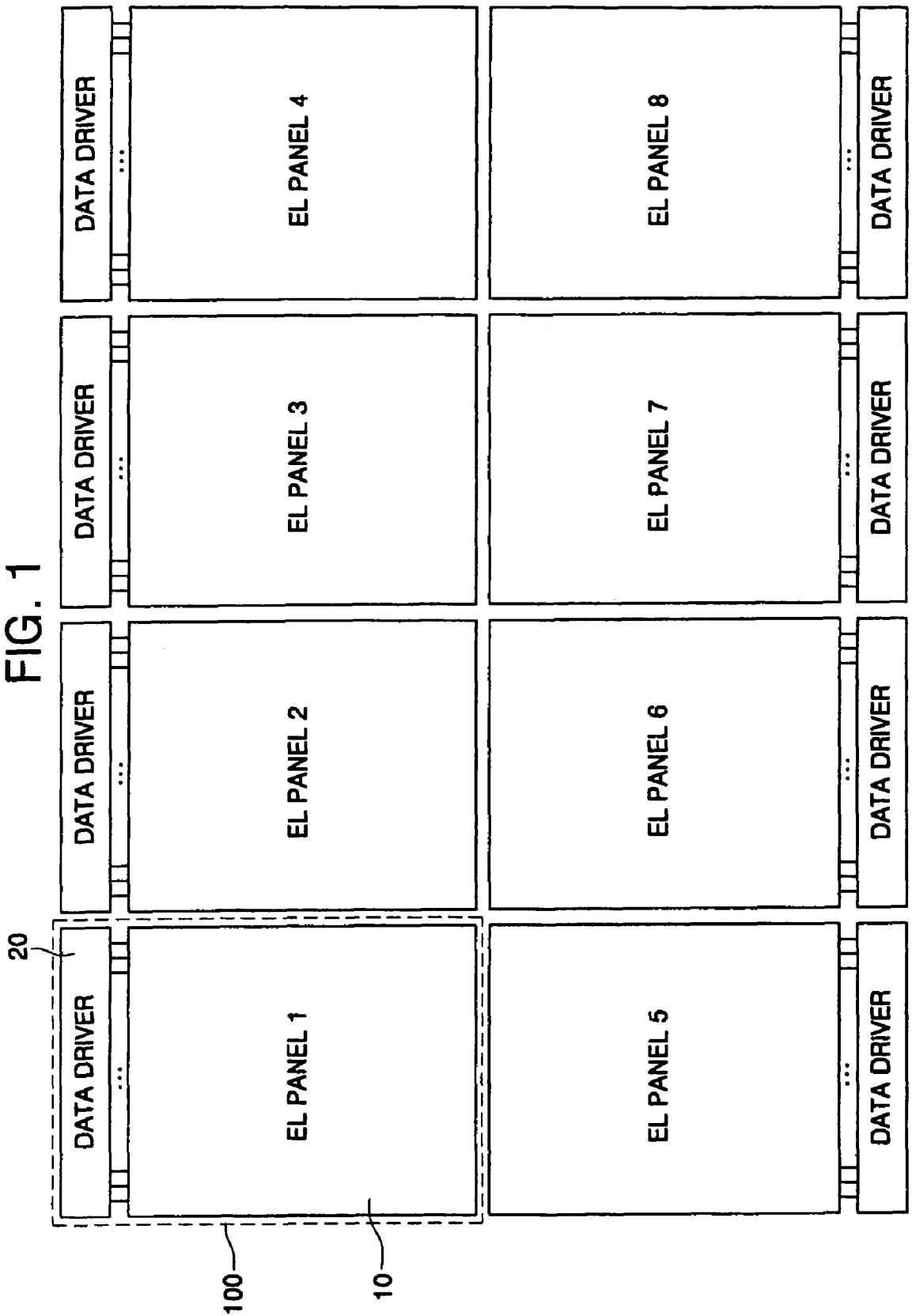
FIG. 1 is a block diagram of an organic light emitting display (OLED) device using a tiling technique.

FIG. 1 is a block diagram of an organic light emitting display (OLED) device using a tiling technique.

Referring to FIG. 1, the OLED device is formed by bonding OLED arrays 100. In FIG. 1, it is illustrated that eight OLED arrays 100, which are arranged four to a row and two to a column, are bonded to one another. However, the OLED device of the present invention may be designed to include a different number of OLED arrays 100 and to have various sizes.

Each of the OLED arrays 100 includes an electroluminescent (EL) panel 10 for displaying a predetermined image, and a data driver 20 for supplying a data signal to the EL panel 10.

The EL panels 10 have similar construction, and edges of the EL panels 10 are bonded to one another using an adhesive to form a combined EL panel. The adhesive may be an ultraviolet (UV) curing resin or a thermal curing resin, for example, epoxy resin.

Each of the EL panels 10 can be produced by the same fabrication process as an EL panel for a conventional OLED array. Accordingly, a large combined EL panel can be fabricated by bonding EL panels that are obtained by the same fabrication process.

Each of the EL panels 10 includes a scan driver, an emission control driver, and pixels, and each of the drivers and pixels includes a thin film transistor (TFT), which has a polysilicon channel in order to obtain fast response speed and high uniformity. In this case, the polysilicon channel may be formed by forming an amorphous silicon (a-Si) layer on a glass substrate and crystallizing the a-Si layer using a low temperature polysilicon (LTPS) process.

The TFTs are formed of polysilicon that is obtained using the LTPS process. Thereafter, the display region, the scan driver, and the emission control driver are formed using the transistors in each of the EL panels 10. The display region includes red (R), green (G), and blue (B) sub-pixels, and the scan and emission control drivers select respective pixels and generate signals for controlling an emission operation. A detailed description of the EL panel 10 will be presented later.

Each of data drivers 20 is designed as an external integrated circuit (IC) using complementary metal oxide semiconductor (CMOS) technology and is electrically coupled to the corresponding EL panel 10. The EL panel 10 may be electrically coupled to the data driver 20 using a metal pattern that is printed on a flexible film. In that case, an output terminal of the data driver 20 is electrically coupled to one end of the metal pattern, and a data line located on the EL panel 10 is electrically coupled to the other end of the metal pattern. This method is referred to as a tape carrier package (TCP) technique. Each of the data drivers 20 transmits a data signal to the display region of the EL panel 10 through conductive lines that are located on the flexible film.

Figure 2:
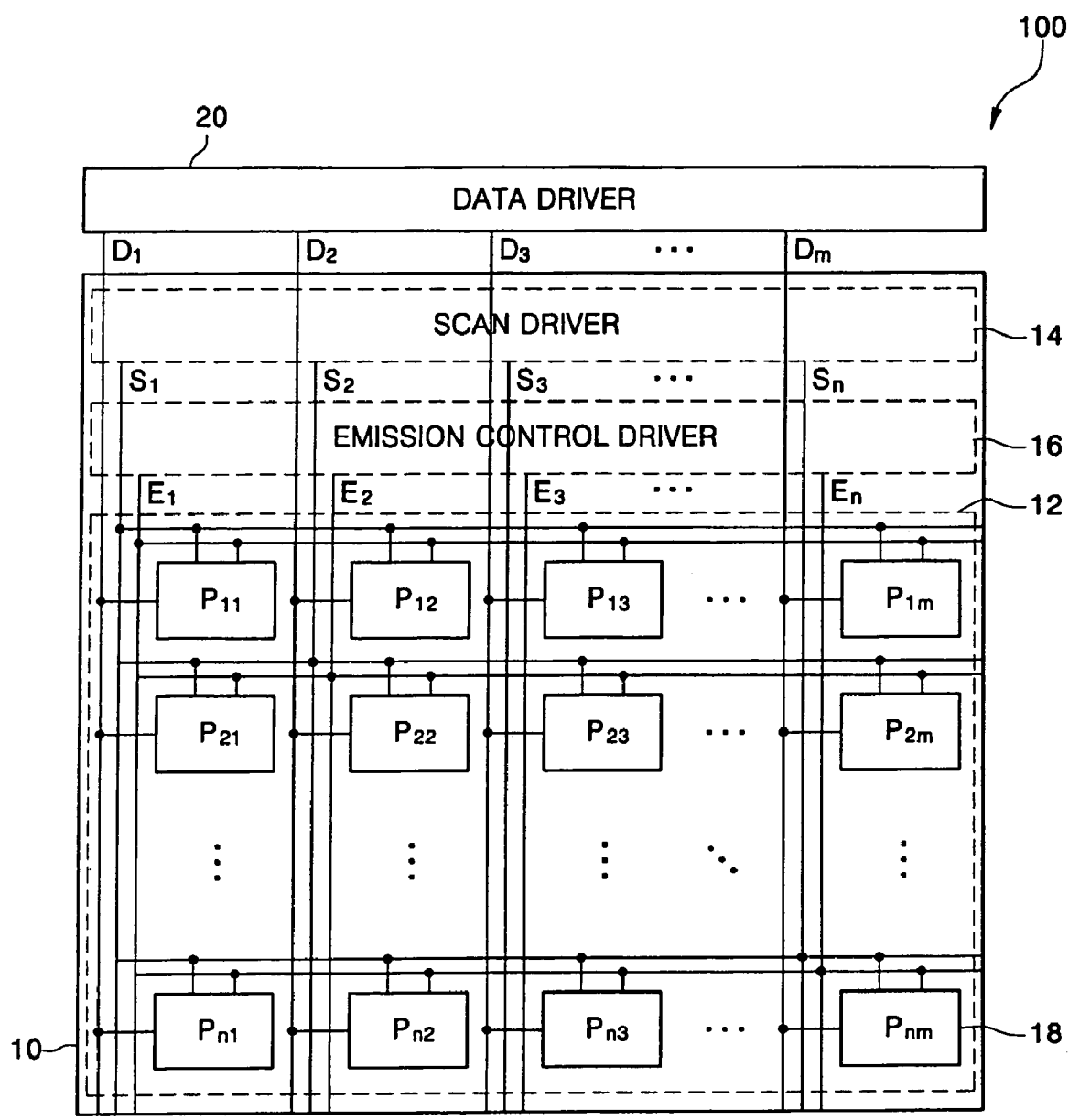
FIG. 2 is a detailed block diagram of the OLED array shown in FIG. 1.

FIG. 2 is a detailed block diagram of the OLED array shown in FIG. 1.

Referring to FIG. 2, the OLED array 100 includes the EL panel 10 and the data driver 20. The EL panel 10 further includes a display region 12, a scan driver 14, and an emission control driver 16.

The display region 12 includes data lines D1-Dm, scan lines S1-Sn, emission control lines E1-En, and pixels P11-Pnm that are formed in pixel regions 18.

The data lines D1-Dm are electrically coupled to the data driver 20 and extend in a vertical direction of the exemplary embodiment shown in FIG. 2. The data lines D1-Dm transmit data signals to the respective pixels P11-Pnm. For example, the data line D1 is coupled to pixels P11-Pn1, the data line D2 is coupled to pixels P12-Pn2, and the data line Dm is coupled to pixels P1m-Pnm.

Unlike in a conventional OLED device, the scan lines S1-Sn and the emission control lines E1-En extend in the same direction as the data lines D1-Dm (i.e., in the vertical direction of the exemplary embodiment shown in FIG. 2). However, each of the scan and emission control lines S1-Sn and E1-En includes a contact hole in order to transmit the same scan and emission control signals to the pixels arranged in a horizontal direction of the exemplary embodiment of FIG. 2. Therefore, metal interconnections, which contact the scan and emission control lines S1-Sn and E1-En through the contact holes, extend in a horizontal direction so that scan and emission control signals are transmitted to the pixels arranged in the horizontal direction. For example, the scan control signal from the scan line S1 and the emission control signal from the emission control line E1 are transmitted to the pixels P11-P1m, the scan and emission control signals from S2 and E2 are transmitted to the pixels P21-P2m, and the scan and emission control signals from Sn and En are transmitted to the pixels Pn1-Pnm.

Each of the pixels P11-Pnm includes R, G, and B sub-pixels that are repeatedly arranged in rows and columns. The pixels include an organic emission layer that emits light. The organic emission layers in the R, G, and B sub-pixels are formed of different organic materials, but are the same in interconnection layout or circuit connection of a driving circuit. Accordingly, each of the pixels P11-Pnm emits R, G, or B light at a luminance corresponding to a data signal applied to the pixel and combines the R, G, and B lights to display a specific color.

In the exemplary embodiment of FIG. 2, the scan driver 14 is formed between the data driver 20 and the display region 12. Since a large panel is formed by bonding a number of EL panels 10 together, the scan driver 14 is formed on the same side as the data driver 20. The scan driver 14 is coupled to scan lines S1-Sn. Thus, the scan driver 14 sequentially transmits scan signals to the display region 12 and sequentially selects the pixels P11-Pnm.

In the exemplary embodiment shown, the emission control driver 16 is formed between the scan driver 14 and the display region 12 and is coupled to the emission control lines E1-En. Thus, the emission control driver 16 sequentially transmits emission control signals to the display region 12 and controls an emission time of each of the pixels P11-Pnm.

The data driver 20 may transmit data signals to the display region 12 of the EL panel 10 through conductive lines located on the flexible film as described above.

According to the embodiments described above, the OLED array 100 includes the EL panel 10 and the data driver 20, and the EL panel 10 includes the display region 12, the scan driver 14, and the emission control driver 16. Hereinafter, the structure and operation of the scan driver 14 will be described in detail with reference to exemplary embodiments of the present invention.

Figure 3:
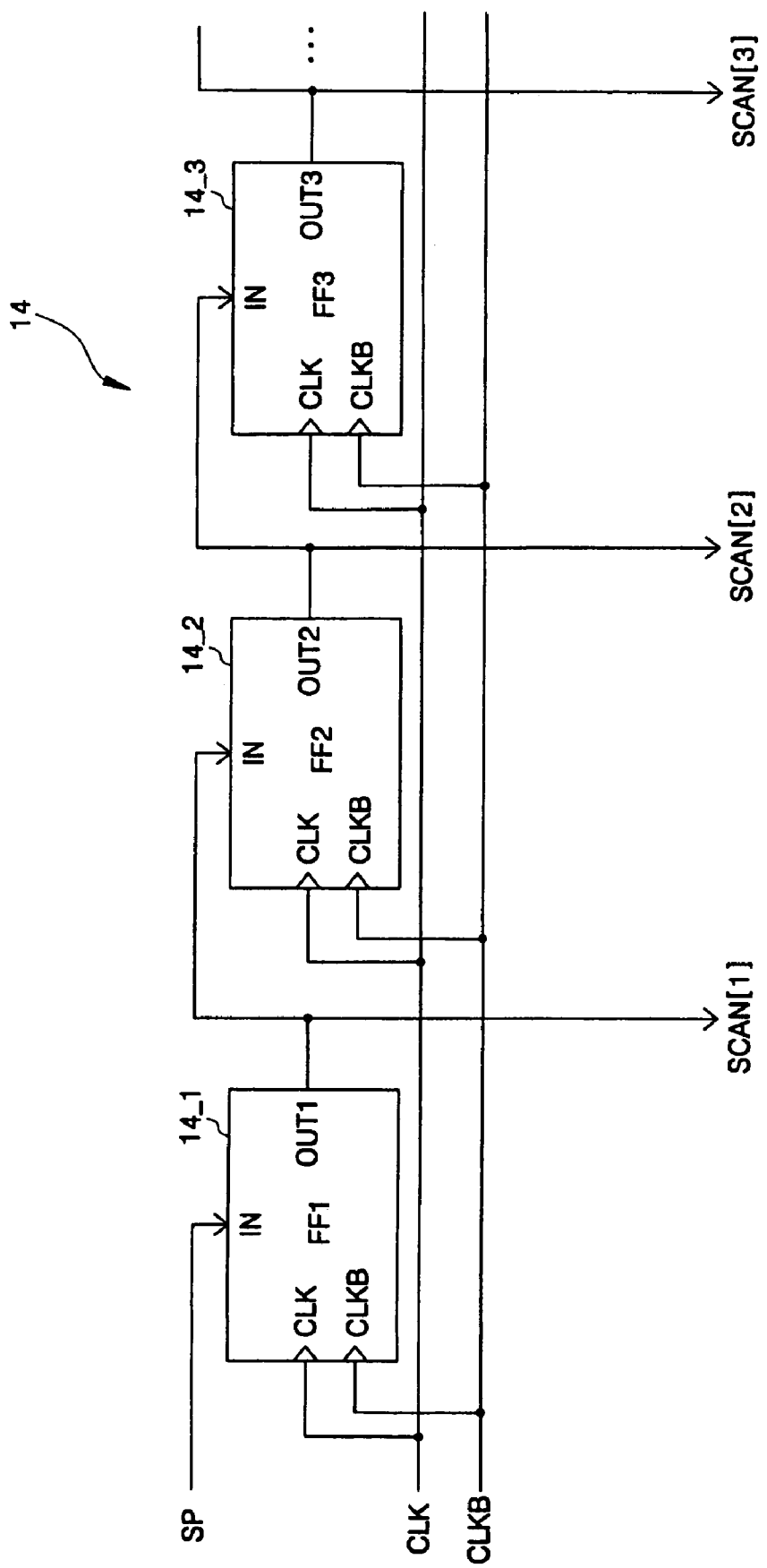
FIG. 3 is a block diagram of a scan driver for the OLED array according to an exemplary embodiment of the present invention.

FIG. 3 is a block diagram of a scan driver for the OLED array according to an exemplary embodiment of the present invention.

Referring to FIG. 3, the scan driver 14 includes flip-flops FF1, FF2, FF3 . . . FFn that are also labeled as a first flip-flop 14_1, a second flip-flop 14_2, a third filp-flop 14_3 and so on. The first flip-flop 14_1 receives a start pulse SP (e.g., a start signal) and outputs a first output signal OUT1 in synchronization with a clock signal CLK and an inverted clock signal CLKB. The first output signal OUT1 is shifted and input to a second flip-flop 14_2. Also, the first output signal OUT1 becomes a first scan signal SCAN[1], which is used to select pixels located in a first row of pixels P11-P1m of the display region 12 of FIG. 2.

The second flip-flop 14_2 receives the first output signal OUT1 and outputs a second output signal OUT2 in synchronization with the clock signal CLK and the inverted clock signal CLKB that are shifted by a half cycle with respect to the first output signal OUT1. The second output signal OUT2 is input to a third flip-flop 14_3. Also, the second output signal OUT2 becomes a second scan signal SCAN[2], which is used to select pixels located in a second row of pixels P21-P2m of the display region 12.

The third flip-flop 14_3 receives the second output signal OUT2 and outputs a third output signal OUT3 in synchronization with the clock signal CLK and the inverted clock signal CLKB that are shifted by a half cycle of the clock signal CLK with respect to the second output signal OUT2. The third output signal OUT3 is input to a fourth flip-flop (not shown).

Also, the third output signal OUT3 becomes a third scan signal that is used to select pixels located in a third row P31-P3m of the display region 12.

The flip-flops 14_1, 14_2, 14_3 and so forth alternately receive the clock signal CLK and the inverted clock signal CLKB, and output scan signals SCAN including SCAN[1], SCAN[2], SCAN[3] and so forth, that are shifted by a half cycle of the clock signal CLK. For example, a clock signal CLK input to an odd flip-flop 14_1 is input as an inverted clock signal CLKB to an even flip-flop 14_2, whereas the inverted clock signal CLKB input to the odd flip-flop 14_1 is input as a clock signal CLK to the even flip-flop 14_2. Thus, the scan signal SCAN can be output every half cycle of the clock signal CLK.

It is illustrated in FIG. 3 that the scan driver 14 includes three flip-flops 14_1, 14_2, and 14_3, but the present invention is not limited to this configuration. Rather, the scan driver 14 may include flip-flops in a number equal to the number of scan signals required (for example n in the case of the exemplary embodiment shown in FIG. 2).

Figure 4A:
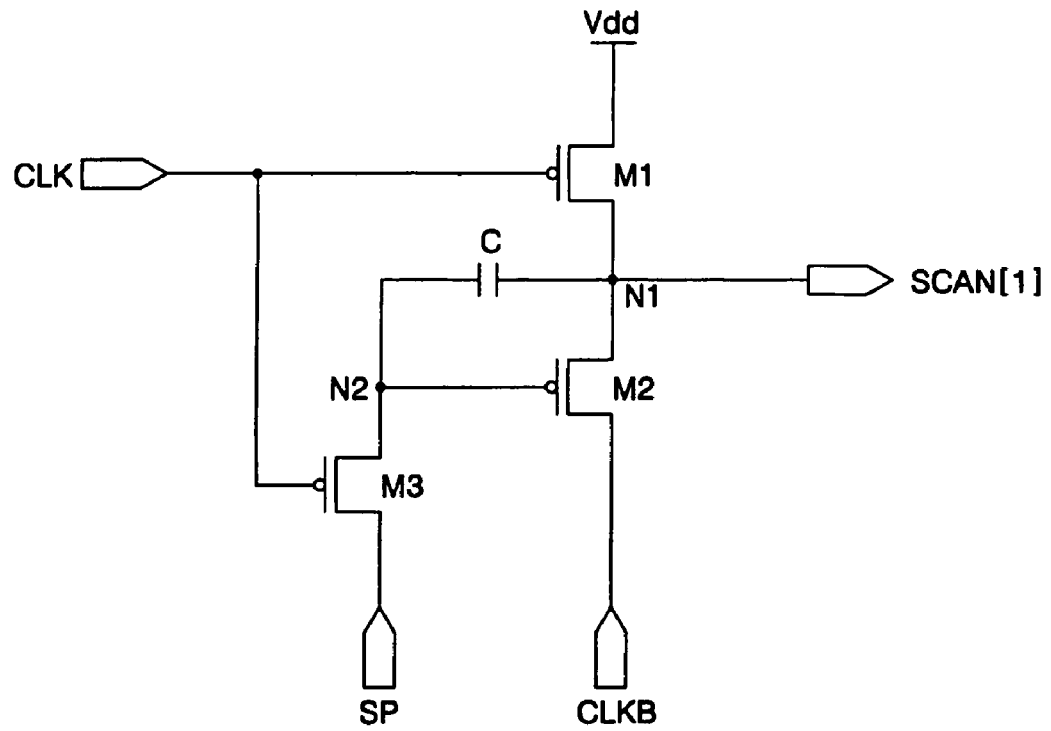
FIG. 4A is a circuit diagram of an odd flip-flop according to an exemplary embodiment of the present invention.

FIG. 4A is a circuit diagram of an odd flip-flop, for example 14_1, 14_3, and the like, according to an exemplary embodiment of the present invention. The first flip-flop 14_1 is shown in FIG. 4A as an example of odd flip-flops.

Referring to FIG. 4A, the odd flip-flop includes three transistors M1, M2, and M3 and a capacitor C.

The first transistor M1 is coupled between a positive power supply voltage line Vdd and a node N1, and a clock signal CLK is input to a gate terminal of the first transistor M1. The node N1 is the signal line for the scan signal being generated by the flip-flop.

The second transistor M2 has a first electrode coupled to the node N1, and a gate terminal coupled to a node N2. The node N2 is the gate terminal of the second transistor M2. An inverted clock signal CLKB is input to a second electrode of the second transistor M2.

The third transistor M3 has a first electrode coupled to the node N2. A start pulse SP is input to a second electrode of the third transistor M3, and the clock signal CLK is input to a gate terminal thereof. In FIG. 4A, the inputs to the first flip-flop 14_1 are shown and therefore input to the second electrode of the third transistor M3 is shown as the start pulse SP which is the input to the first flip-flop 14_1. As described with reference to FIG. 3, each of flip-flops 14_2, 14_3, ... other than the first flip-flop 14_1 receives an output signal of the previous flip-flop as an input signal. So other odd flip-flops, such as 14_3, would receive other input signals, such as SCAN[2], at the second electrode of their third transistor M3.

Figure 4B:
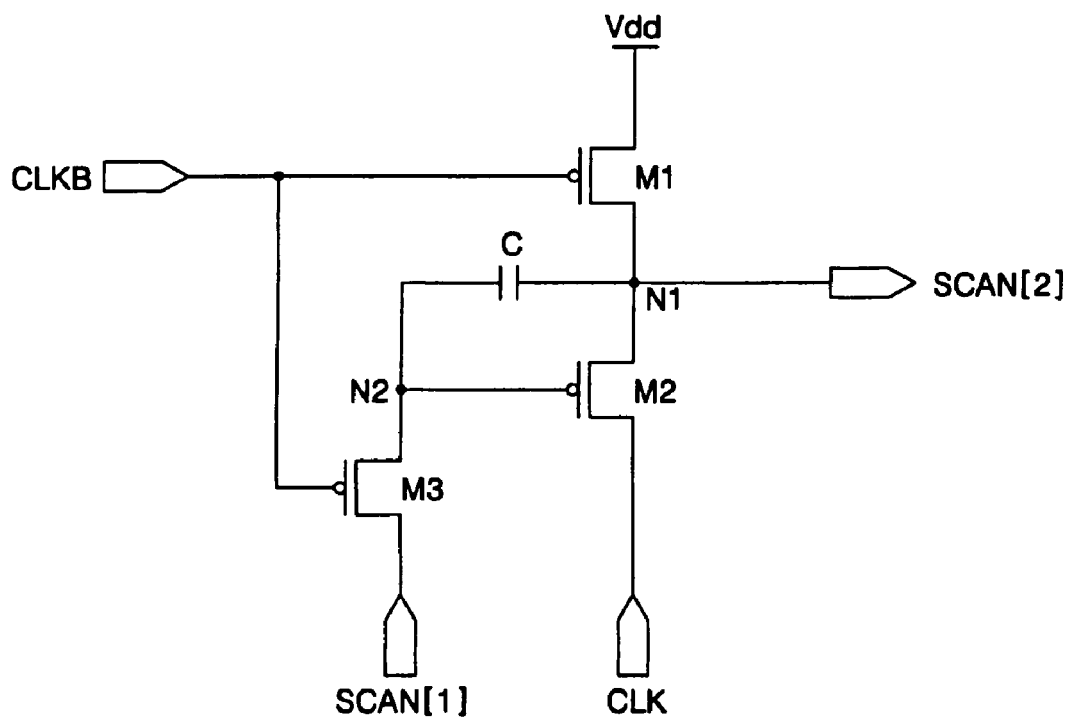
FIG. 4B is a circuit diagram of an even flip-flop according to an exemplary embodiment of the present invention.

The first through third transistors M1, M2, and M3 are metal oxide semiconductor field effect transistors (MOSFETs) of the same conductivity type. In FIG. 4A and FIG. 4B, it will be described that the first through third M1, M2, and M3 are shown as p-type MOSFETs, but the present invention is not limited to this conductivity type.

The capacitor C is coupled between the nodes N1 and N2 and maintains a voltage between the first electrode and the gate terminal of the second transistor M2. The capacitor C allows the flip-flop to be pulled down and generally leads the flip-flop to be in the same full-swing as a driving voltage.

For example, when the clock signal CLK is at a low level, the inverted clock signal CLKB is at a high level, and the start pulse SP is at a low level, both the first and third transistors M1 and M3 are turned on. Thus, a low-level start pulse SP is input to the gate terminal of the second transistor M2, so that the second transistor M2 is also turned on. However, because the high-level inverted clock signal CLKB is applied to the second electrode of the second transistor M2, no current flows through the second transistor M2. Thus, a high-level scan signal SCAN, that is SCAN[1] in the exemplary case shown, is output through a scan line coupled to the node N1. In this case, since the inverted clock signal CLKB is elevated to a high level, a voltage difference between a source electrode and a drain electrode of the second transistor M2 becomes 0 V, thus static current is completely cut off from the second transistor M2.

Next, when the clock signal CLK is at a high level, the inverted clock signal CLKB is at a low level, and the start pulse SP is at a high level, both the first and third transistors M1 and M3 are turned off. In this case, since the low-level inverted clock signal CLKB is applied to the second electrode of the second transistor M2, the second transistor M2 is turned on. As current flows through the second transistor M2 due to a high-level voltage stored in the node N1, a voltage at the node N1 is dropped as much as the low-level inverted clock signal CLKB. Specifically, as the third transistor M3 is turned off, the node N2 coupled to one terminal of the capacitor C is floated. Thus, a voltage at the node N2 is dropped as much as the voltage at the node N1 so that the voltage at the node N2 can be pulled down. As a result, a low-level scan signal SCAN[1] is output to a scan line coupled to the node N1.

FIG. 4B is a circuit diagram of an even flip-flop, for example 14_2, 14_4, and the like, according to an exemplary embodiment of the present invention. The second flip-flop 14_2 is shown in FIG. 4B as an example of even flip-flops.

Referring to FIG. 4B, the even flip-flop has the same construction as the odd flip-flop shown in FIG. 4A. That is, the even flip-flop includes three transistors M1, M2, and M3 and a capacitor C. For brevity of explanation, a description of the construction of the even flip-flop will be omitted here.

However, a clock signal CLK and an inverted clock signal CLKB are input in inverse relation to the odd flip-flop. Also, the output signal SCAN[1] of the previous odd flip-flop is input instead of the start pulse SP. Specifically, the inverted clock signal CLKB is input to a gate terminal of the first transistor M1 and a gate terminal of the third transistor M3, and the clock signal CLK is input to a second electrode of the second transistor M2. Also, the output signal SCAN[1] of the previous odd flip-flop is input to a second electrode of the third transistor M3.

The above-described even flip-flop operates in the same manner as the odd flip-flop as described with reference to FIG. 4A and outputs a scan signal SCAN[2] in synchronization with a clock signal CLK that is shifted by a half clock cycle with respect to the inverted clock signal CLKB input to the previous flip flop.

As described above, the scan driver of the present invention alternately inputs a clock signal CLK and an inverted clock signal CLKB to each of the flip-flops and outputs a scan signal that is shifted by a half clock cycle.

In the embodiment of the present invention, each of the flip-flops includes the three transistors M1, M2, M3 and one capacitor C. Thus, layout area can be minimized owing to simplification of circuits. Also, when a high-level scan signal SCAN is output, the flow of static current is prevented due to a high-level signal that is applied to a drain terminal of the second transistor M2. As a result, power consumption can be reduced. Furthermore, since the capacitor C is coupled between the source and gate of the second transistor M2, when a low-level scan signal SCAN is output, sufficient pull-down operation is enabled.

Hereinafter, the operation of the scan driver including flip-flops will be described with reference to FIG. 5.

Figure 5:
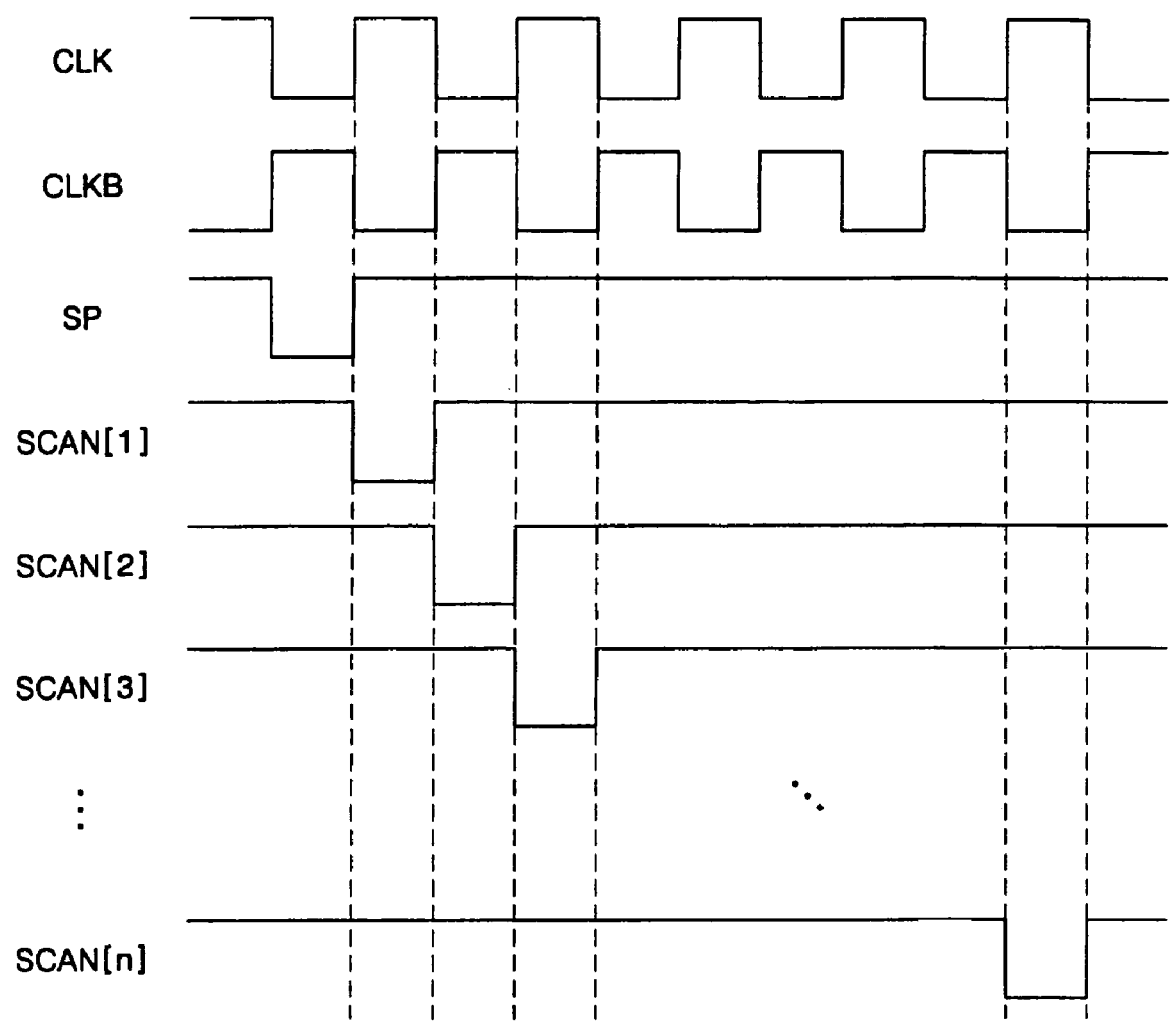
FIG. 5 is a timing diagram illustrating the operation of the scan driver shown in FIG. 3.

FIG. 5 is a timing diagram illustrating the operation of the scan driver shown in FIG. 3.

First, the operation of the first flip-flop 14_1 that is a representative odd flip-flop will be described with reference to FIGS. 3, 4A, 4B, and 5.

Referring to FIGS. 3 through 5, a low-level clock signal CLK, a high-level inverted clock signal CLKB, and a low-level start pulse SP are input. In this case, all the first, second, and third transistors M1, M2, and M3 are turned on. Thus, the node N1 outputs a high-level scan signal SCAN[1]. Here, the second transistor M2 is turned on, but a voltage between the source and drain of the second transistor M2 becomes 0V due to the high-level inverted clock signal CLKB applied to the second electrode of the second transistor M2, so that the flow of static current can be substantially cut off. As a result, power consumption caused by the static current is reduced.

Thereafter, the clock signal CLK is shifted by a half clock cycle so that a high-level clock signal CLK, a low-level clock signal CLKB, and a high-level start pulse SP are input to the first flip-flop 14_1. Thus, both the first and third transistors M1 and M3 are turned off. In this case, one terminal of the capacitor C coupled to the node N2 is floated. While the second transistor M2 is being turned on, current flows due to a voltage difference between the source and gate of the second transistor M2 and a voltage difference between the source and drain of this transistor. Accordingly, a voltage at the node N1 is dropped as much as the low-level inverted clock signal CLKB, thus the node N1 outputs a low-level scan signal SCAN[1].

Thereafter, the clock signal CLK is shifted by a half clock cycle so that a low-level clock signal CLK, a high-level inverted clock signal CLKB, and a high-level start pulse SP are input to the first flip-flop 14_1. In this case, the second transistor M2 is turned off due to the high-level start pulse SP, and the node N1 outputs a high-level scan signal SCAN[1].

From the next cycle, although the clock signal CLK and the inverted clock signal CLKB make an upward or downward transition, since the start pulse SP is fixed at a high level, the node N1 always remains at a high level.

Next, the operation of the second flip-flop 14_2 that is a representative even flip-flop will be described. The second flip-flop 14_2 receives the clock signal CLK that is shifted by a half clock cycle.

Specifically, a high-level clock signal CLK, a low-level inverted clock signal CLKB, and a low-level scan signal SCAN[1] are input to the second flip-flop 14_2. In this case, all the first, second, and third transistors M1, M2, and M3 are turned on. Thus, the node N1 outputs a high-level scan signal SCAN[2]. Here, the second transistor M2 is turned on, but a voltage between the source and drain of the second transistor M2 becomes 0V due to the high-level clock signal CLK applied to the second electrode of the second transistor M2, so that the flow of static current can be substantially cut off. As a result, power consumption caused by the static current is reduced.

Thereafter, the clock signal CLK is shifted by a half clock cycle so that a low-level clock signal CLK, a high-level inverted clock signal CLKB, and a high-level scan signal SCAN[1] are input to the second flip-flop 14_2. Thus, both the first and third transistors M1 and M3 are turned off in response to the high-level inverted clock signal CLKB. In this case, one terminal of the capacitor C coupled to the node N2 is floated. While the second transistor M2 is being turned on due to a voltage difference between the source and gate thereof, a voltage difference between the source and drain of the second transistor M2 arises from the low-level clock signal CLK, so that current flows. Accordingly, a voltage at the node N1 is dropped as much as the low-level clock signal CLK, thus the node N1 outputs a low-level scan signal SCAN [2].

Thereafter, the clock signal CLK is shifted by a half clock cycle so that a high-level clock signal CLK, a low-level inverted clock signal CLKB, and a high-level scan signal SCAN[1] are input to the second flip-flop 14_2. In this case, the second transistor M2 is turned off due to the high-level scan signal SCAN[1], and the node N1 outputs a high-level scan signal SCAN[2].

From now on, although the clock signal CLK and the inverted clock signal CLKB make an upward or downward transition every half cycle, since the scan signal SCAN[1] is fixed at a high level, the node N1 always remains at a high level.

Subsequently, the remaining flip-flops 14_3, 14_4, and so forth, perform the same operations as the first and second flip-flops 14_1 and 14_2 and output scan signals SCAN.

As described above, the scan driver of the present invention makes use of three transistors and one capacitor and outputs the scan signal SCAN[n] every half cycle of the clock signal CLK.

In FIGS. 4A and 4B, a clock signal CLK and an inverted clock signal CLKB are directly input to a gate terminal of a transistor. Thus, when the clock signal CLK is delayed due to a line load, an output signal (i.e., a scan signal SCAN) also may be delayed. In particular, when the transistor has a large size, a delay in the scan signal makes application of a data signal incorrect, thus an undesirable image may be displayed.

Figure 6A:
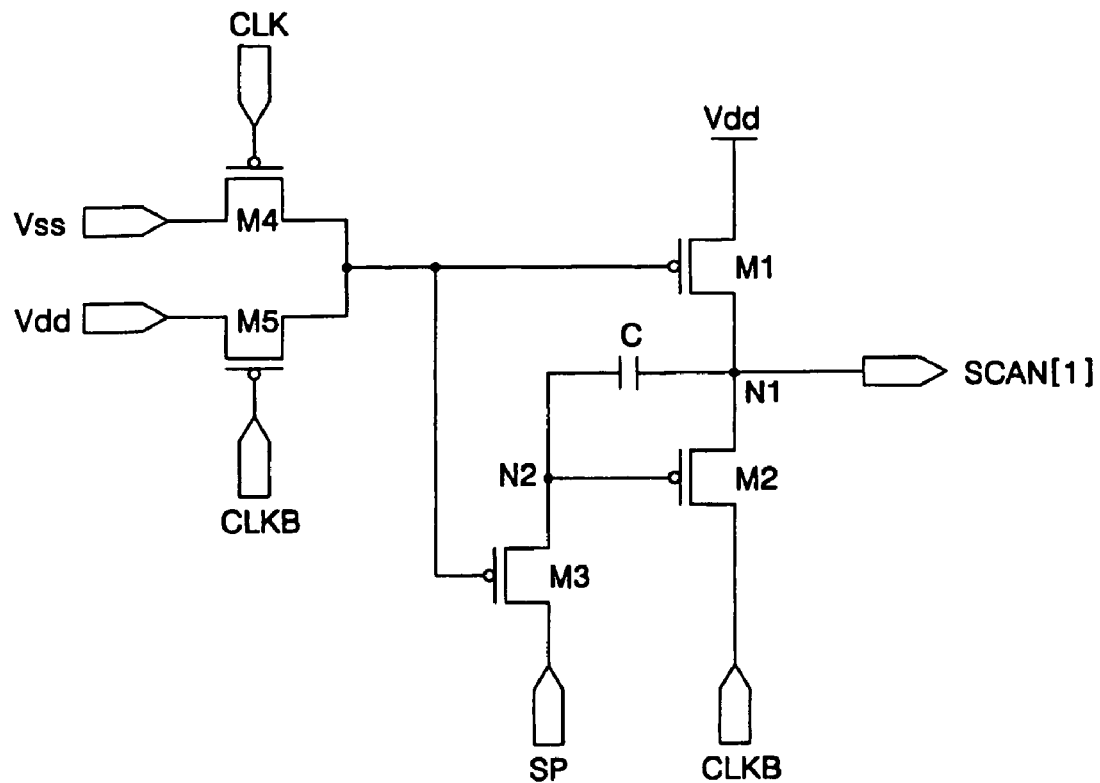
FIG. 6A is a circuit diagram of an odd flip-flop according to an alternative exemplary embodiment of the present invention.

FIG. 6A is a circuit diagram of an odd flip-flop according to an alternative exemplary embodiment of the present invention.

Referring to FIG. 6A, the odd flip-flop has almost the same construction as the odd flip-flop shown in FIG. 4A. Thus, a description of the same components will be omitted here.

Referring to FIG. 6A, a control signal input portion is coupled to gate terminals of a first transistor M1 and a third transistor M3. The control signal input portion includes two transistors M4 and M5. The fourth transistor M4 is coupled between a negative power supply voltage terminal Vss and the gate terminals of the first and third transistors M1 and M3, and a clock signal CLK is input to a gate terminal thereof. The fifth transistor M5 is coupled between a positive power supply voltage terminal Vdd and the gate terminals of the first and third transistors M1 and M3, and an inverted clock signal CLKB is input to a gate terminal of the fifth transistor M5.

Accordingly, once a low-level clock signal CLK is input, the fourth transistor M4 is turned on, so that the negative power supply voltage Vss is commonly applied to the gate terminals of the first and third transistors M1 and M3. Also, once a low-level inverted clock signal CLKB is input, the fifth transistor M5 is turned on, so that a positive power supply voltage Vdd is commonly applied to the gate terminals of the first and third transistors M1 and M3. Since the operating principle of the odd flip-flop of FIG. 6A is the same as the odd flip-flop of FIG. 4A, a description thereof will be omitted here.

Figure 6B:
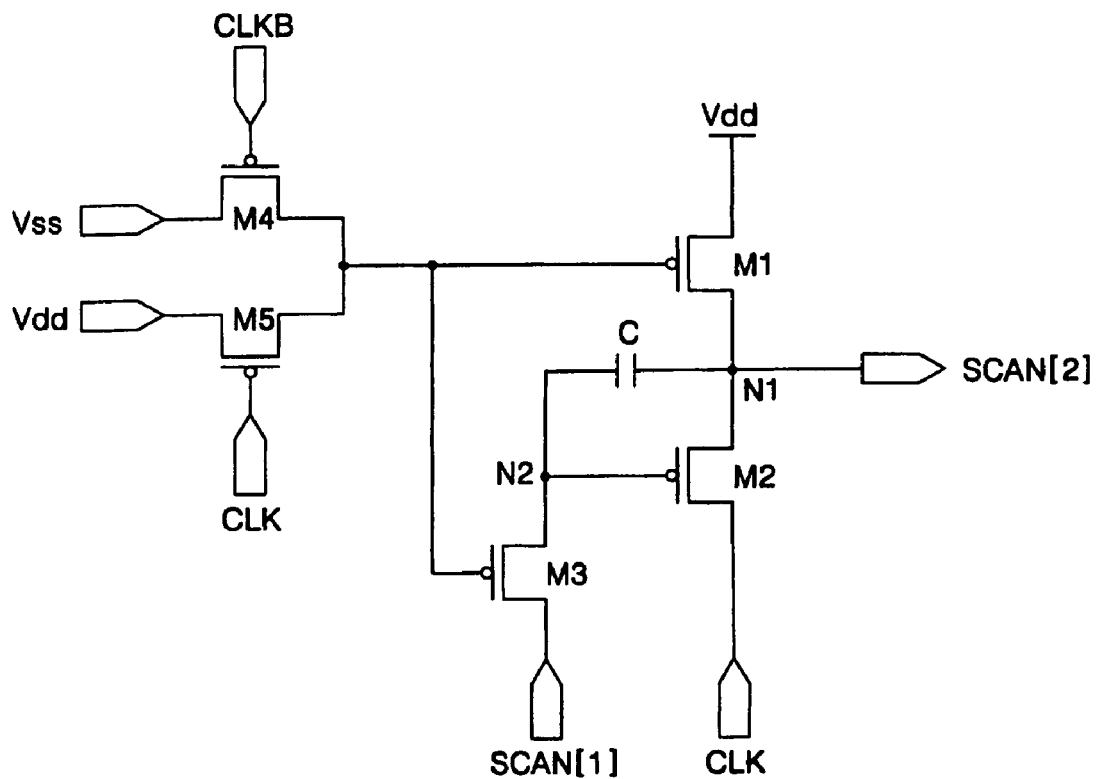
FIG. 6B is a circuit diagram of an even flip-flop according to an alternative exemplary embodiment of the present invention.

FIG. 6B is a circuit diagram of an even flip-flop according to an alternative exemplary embodiment of the present invention.

Referring to FIG. 6B, the alternative even flip-flop has the same construction as the odd flip-flop shown in FIG. 6A. However, a clock signal CLK and an inverted clock signal CLKB are input in inverse relation to the odd flip-flop shown in FIG. 6A. Accordingly, in the even flip-flop of FIG. 6B, the inverted clock signal CLKB is input to a terminal to which the clock signal CLK is input in the odd flip-flop of FIG. 6A, while the clock signal CLK is input to a terminal to which the inverted clock signal CLKB is input in the odd flip-flop of FIG. 6A. Since the operations of the even flip-flop of FIG. 6B are the same as that of the even flip-flop of FIG. 4B, a description thereof will not be repeated here.

In the alternative embodiment of the present invention, shown in FIGS. 6A and 6B, since each of the flip-flops includes the three transistors M1, M2, and M3 and a capacitor C, layout area can be minimized due to simplification of circuits. Also, when a high-level scan signal SCAN is output, the flow of static current is prevented due to a high-level signal that is applied to a drain terminal of the second transistor M2. As a result, power consumption can be reduced. Furthermore, since the capacitor C is coupled between a source terminal and a gate terminal of the second transistor M2, when a low-level scan signal SCAN is output, a sufficient pull-down operation is enabled. In addition, each of the odd and even flip-flops of the alternative embodiment, includes the control signal input portion unlike the first embodiment, with the result that a delay in an output signal caused by a delay in the clock signal CLK can be prevented.

According to the present invention as described above, a display panel includes flip-flops, each of which is comprised of three transistors and a capacitor, so that layout area is minimized with simplification of circuits while facilitating construction of an SOP-type display panel.

Also, when a high-level scan signal is output, the flow of static current into a second transistor is cut off, thus reducing power consumption.

Furthermore, as the capacitor is coupled between a source terminal and a gate terminal of the second transistor, a low-level scan signal can be output in the same waveform as a driving voltage so that a sufficient pull-down operation is enabled.

Consequently, the present invention provides not only a simplified SOP-type scan driver but also an OLED device that can minimize power consumption.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting display device comprising:
    a display region comprising pixels for displaying an image;
    a scan driver comprising scan signal circuits for applying a scan signal to select the pixels;
    a data driver for applying a data signal to the selected pixels; and
    an emission control driver for applying an emission control signal for controlling an emission operation of the pixels,
    wherein at least one of the scan signal circuits of the scan driver includes a three-transistor flip-flop having only three transistors, two of which are configured to be driven by a same control signal, the three-transistor flip-flop including:
        a first transistor, coupled between
            a constant positive power supply voltage terminal configured to supply a constant positive power supply voltage, and
            a signal line for the scan signal, and configured to turn on/off by the same control signal being applied to a gate terminal of the first transistor;
        a second transistor, connected between the signal line for the scan signal and either a signal line for a clock signal or a signal line for an inverted clock signal, and configured to turn on/off according to a voltage at a gate terminal of the second transistor;
        a third transistor comprising a first electrode coupled to the gate terminal of the second transistor, and a second electrode configured to transmit an input signal to the first electrode by the same control signal being applied to a gate terminal of the third transistor; and
        a control signal input portion, commonly coupled to the gate terminal of the first transistor and the gate terminal of the third transistor, and for applying the same control signal of a low or high level in response to either a clock signal or an inverted clock signal.

2. The organic light emitting display device according to claim 1, wherein the three-transistor flip-flop further includes a capacitor coupled between a source terminal and a gate terminal of the second transistor for maintaining a voltage for a predetermined time.

3. The organic light emitting display device according to claim 1, wherein
    the at least one of the scan signal circuits includes an even scan signal control circuit and an odd scan signal control circuit, and
    the clock signal and the inverted clock signal are alternately input to the three-transistor flip-flop of the odd scan signal circuit and the three-transistor flip-flop of the even scan signal circuit.

4. The organic light emitting display device according to claim 3, wherein the three-transistor flip-flop of the at least one of the scan signal circuits is
    for outputting the scan signal via the signal line for the scan signal, and
    for inputting the scan signal as the input signal to the three-transistor flip-flop of a next one of the at least one of the scan signal circuits.

5. The organic light emitting display device according to claim 4, wherein the three-transistor flip-flop of the at least one of the scan signal circuits is for outputting the scan signal every half cycle of the clock signal.

6. The organic light emitting display device according to claim 1, wherein the first transistor, the second transistor, and the third transistor are PMOS transistors.

7. An organic light emitting display device comprising:
    a data driver for generating data signals corresponding to an image to be displayed by the device; and
    an electroluminescent panel coupled to the data driver, the electroluminescent panel comprising:
        a scan driver for generating scan signals, the scan driver comprising:
            scan signal circuits, each scan signal circuit comprising a three-transistor flip-flop having only three transistors, two of the three transistors being configured to be driven by a same control signal,
            wherein the three-transistor flip-flops are coupled together, a first three-transistor flip-flop of the three-transistor flip-flops for receiving a clock signal as the same control signal and a start pulse as an input signal and generating a first scan signal, a second three-transistor flip-flop of the three-transistor flip-flops for receiving an inverted clock signal as another same control signal and the first scan signal as an input signal and generating a second scan signal, the second scan signal being shifted by a half cycle of the clock signal with respect to the first scan signal;

an emission control driver for generating emission control signals; and a display region including pixels coupled to the data driver, the scan driver and the emission control driver, for receiving the data signals, the scan signals and the emission control signals, the pixels being controlled by the scan signals and the emission control signals, the pixels for generating light according to the data signals, wherein each of the three-transistor flip-flops includes three transistors of a first conductivity type and a capacitor.

8. A method for generating scan signals for driving an organic light emitting display device having a scan driver comprising scan signal circuits, each scan signal circuit comprising a three-transistor flip-flop having only three transistors, two of the three transistors being driven by a same control signal, wherein the three-transistor flip-flops are coupled together in series, a first one of the three-transistor flip-flops for receiving a start pulse as input and each of the three-transistor flip-flops after the first one of the three-transistor flip-flops for receiving an output signal of a previous one of the three-transistor flip-flops as input, and the output signal of each one of the three-transistor flip-flops being one of the scan signals, the method comprising:

providing a clock signal having a low level during a first half clock cycle as the same control signal to the first one of the three-transistor flip-flops;

providing the start pulse having the low level during the first half clock cycle as the input to the first one of the three-transistor flip-flops;

generating a first one of the scan signals by the first one of the three-transistor flip -flops, the first one of the scan signals having a high level during the first half clock cycle and the low level during a second half clock cycle;

providing an inverted clock signal having the low level during the second half clock cycle as another same control signal to a second one of the three-transistor flip-flops coupled to the first one of the three-transistor flip-flops;

providing the first one of the scan signals as the input to the second one of the three -transistor flip-flops; and generating a second one of the scan signals by the second one of the three-transistor flip -flops, the second one of the scan signals having the high level during the first half clock cycle and the second half clock cycle and the low level during a third half clock cycle, wherein the three-transistor flip-flops include transistors of only a first conductivity type.

9. The method of claim 8, further comprising:

providing the inverted clock signal to the first one of the three-transistor flip-flops for preventing static current through the first one of the three-transistor flip-flops; and providing the clock signal to the second one of the three-transistor flip-flops for preventing static current through the second one of the three-transistor flip-flops.

10. The method of claim 8, further comprising providing storage capacitance in the three-transistor flip-flops for sufficient pull-down.

11. An organic light emitting display device comprising:
a display region comprising pixels for displaying an image;
a scan driver comprising three-transistor flip-flops for applying a scan signal to select the pixels;
a data driver for applying a data signal to the selected pixels; and
an emission control driver for applying an emission control signal to control an emission operation of the pixels,
wherein at least one of the three-transistor flip-flops of the scan driver has only three transistors, two of which are configured to be driven by a same control signal, the at least one of the three-transistor flip-flops including:
a first transistor, coupled between
a constant positive power supply voltage terminal configured to supply a constant positive power supply voltage, and
a signal line for the scan signal, and configured to turn on/off by the same control signal being applied to a gate terminal of the first transistor;
a second transistor, connected between the signal line for the scan signal and a signal line for an inverted same control signal, and configured to turn on/off according to a voltage at a gate terminal of the second transistor; and
a third transistor comprising a first electrode coupled to the gate terminal of the second transistor, and a second electrode configured to transmit an input signal to the first electrode by the same control signal being applied to a gate terminal of the third transistor.

12. The organic light emitting display device according to claim 11, wherein the at least one of the three-transistor flip-flops of the scan driver further includes a capacitor, coupled between a source terminal and the gate terminal of the second transistor, for maintaining a voltage for a predetermined time.

13. The organic light emitting display device according to claim 12, wherein the same control signal applied to the at least one of the three-transistor flip -flops of the scan driver is either a clock signal or an inverted clock signal, and wherein the clock signal and the inverted clock signal are alternately input to an odd three-transistor flip-flop and an even three-transistor flip-flop, respectively, from among the three-transistor flip-flops.

14. The organic light emitting display device according to claim 13, wherein the at least one of the three-transistor flip-flops is for outputting the scan signal via the signal line for the scan signal, and for inputting the scan signal as the input signal to a next three-transistor flip-flop from among the three-transistor flip-flops.

15. The organic light emitting display device according to claim 14, wherein the at least one of the three-transistor flip-flops is for outputting the scan signal every half cycle of the clock signal.

16. The organic light emitting display device according to claim 15, wherein the first transistor, the second transistor, and the third transistor are PMOS transistors.

* * * * *